US007001710B2

(12) United States Patent
Choi et al.

(10) Patent No.: US 7,001,710 B2
(45) Date of Patent: Feb. 21, 2006

(54) METHOD FOR FORMING ULTRA FINE CONTACT HOLES IN SEMICONDUCTOR DEVICES

(76) Inventors: Sang-Tae Choi, San 136-1, Ami-ri, Bubal-eub, Ichon-shi, Kyoungki-do (KR) 467-860; Seung-Weon Paek, San 136-1, Ami-ri, Bubal-eub, Ichon-shi, Kyoungki-do (KR) 467-860

( * ) Notice: Subject to any disclaimer, the term of this patent is extended or adjusted under 35 U.S.C. 154(b) by 369 days.

(21) Appl. No.: 10/623,419

(22) Filed: Jul. 18, 2003

(65) Prior Publication Data

US 2004/0072104 A1 Apr. 15, 2004

(30) Foreign Application Priority Data

Jul. 19, 2002 (KR) ..................... 10-2002-0042319

(51) Int. Cl.
*G03C 5/00* (2006.01)

(52) U.S. Cl. ...................... 430/296; 430/315; 430/324; 430/327; 430/328; 430/330; 430/942; 430/945

(58) Field of Classification Search ................ 430/296, 430/315, 324, 327, 328, 330, 942, 945
See application file for complete search history.

(56) References Cited

U.S. PATENT DOCUMENTS

| | | | | |
|---|---|---|---|---|
| 5,178,989 | A | 1/1993 | Heller et al. | 430/323 |
| 5,326,675 | A | 7/1994 | Niki et al. | 430/326 |
| 6,127,098 | A | 10/2000 | Nakagawa et al. | 430/315 |
| 6,210,868 | B1 | 4/2001 | Yoshii | 430/325 |
| 6,277,546 | B1 | 8/2001 | Breyta et al. | 430/322 |
| 6,420,098 | B1 | 7/2002 | Mautz | 430/313 |
| 6,485,895 | B1 | 11/2002 | Choi et al. | 430/330 |
| 6,524,753 | B1 * | 2/2003 | Choi et al. | 430/5 |

FOREIGN PATENT DOCUMENTS

| | | |
|---|---|---|
| JP | 07-261392 | 10/1995 |
| JP | 09-205270 | 8/1997 |
| JP | 10-070354 | 3/1998 |
| JP | 10-301300 | 11/1998 |
| JP | 2000-174127 | 6/2000 |
| JP | 2001-100428 | 4/2001 |
| KR | 2001-57071 | 7/2001 |

* cited by examiner

*Primary Examiner*—Christopher G. Young
(74) *Attorney, Agent, or Firm*—Marshall, Gerstein & Borun LLP

(57) ABSTRACT

A method for forming an ultra fine contact hole includes: forming a KrF photoresist pattern on a semiconductor substrate providing an insulation layer, the KrF photoresist pattern exposing a predetermined region for forming a contact hole on the insulation layer; forming a chemically swelling process (CSP) chemical material-containing layer being reactive to the KrF photoresist pattern on an entire surface of the semiconductor substrate; forming a chemical material-containing pattern encompassing the KrF photoresist pattern by reacting the chemical material-containing layer with the KrF photoresist pattern through a chemically swelling process to decrease a critical dimension of the contact hole; rinsing the semiconductor substrate; and increasing a thickness of a sidewall of the chemical material-containing pattern to a predetermined thickness by performing a resist flow process (RFP) that makes the chemical material-containing pattern flowed to decrease the critical dimension (CD) of the contact hole.

7 Claims, 3 Drawing Sheets

METHOD FOR FORMING ULTRA FINE CONTACT HOLES IN SEMICONDUCTOR DEVICES

TECHNICAL FIELD

Methods for fabricating semiconductor devices and, more specifically, methods for forming an ultra fine contact hole in a semiconductor device by using a KrF light source.

DESCRIPTION OF RELATED ART

When performing a photo-exposure process, a light source of KrF having a wavelength of about 248 nm is employed for micronization of the pattern, which results in semiconductor devices that are highly integrated. However, the above photo-exposure process using the KrF light source has a limitation in forming an ultra fine pattern having a size below about 100 nm. Therefore, instead of using the KrF light source, a light source of ArF having a shorter wavelength of about 193 nm is currently employed for the photo-exposure process for ultra fine patterns.

However, a photoresist for the ArF light source has a weak molecular structure compared to that for the KrF light source. As a result, a portion of the pattern exposed to electrons when using a scanning electron microscope (SEM) for measuring the critical dimension (CD) is prone to deformations and a resistance to an etch is also weakened. Also, since a mask process cannot be performed with use of the existing photo-exposure equipment, new equipment is necessary, resulting in an increase in manufacturing costs.

SUMMARY OF THE DISCLOSURE

A disclosed method for forming an ultra fine contact hole of which size is below about 100 nm comprises employing a photo-exposure process using a KrF light source accompanied with a chemically swelling process (CSP) and a resist flow process (RFP).

More specifically, the disclosed method comprises: forming a KrF photoresist pattern on a semiconductor substrate providing an insulation layer, the KrF photoresist pattern exposing a predetermined region for forming a contact hole on the insulation layer; forming a chemically swelling process (CSP) chemical material-containing layer being reactive to the KrF photoresist pattern on an entire surface of the semiconductor substrate; forming a chemical material-containing pattern encompassing the KrF photoresist pattern by reacting the chemical material-containing layer with the KrF photoresist pattern through a chemically swelling process to decrease a critical dimension of the contact hole; rinsing the semiconductor substrate; and increasing a thickness of a sidewall of the chemical material-containing pattern to a predetermined thickness by performing a resist flow process (RFP) that makes the chemical material-containing pattern flowed to decrease the critical dimension (CD) of the contact hole.

BRIEF DESCRIPTION OF THE DRAWINGS

The above and other features of the disclosed methods will become apparent from the following description of the preferred embodiments given in conjunction with the accompanying drawings, wherein.

DETAILED DESCRIPTION OF THE PRESENTLY PREFERRED EMBODIMENTS

FIGS. 1A to 1E are cross-sectional views illustrating a disclosed method for forming an ultra fine contact hole in a semiconductor device.

Figure 1A:
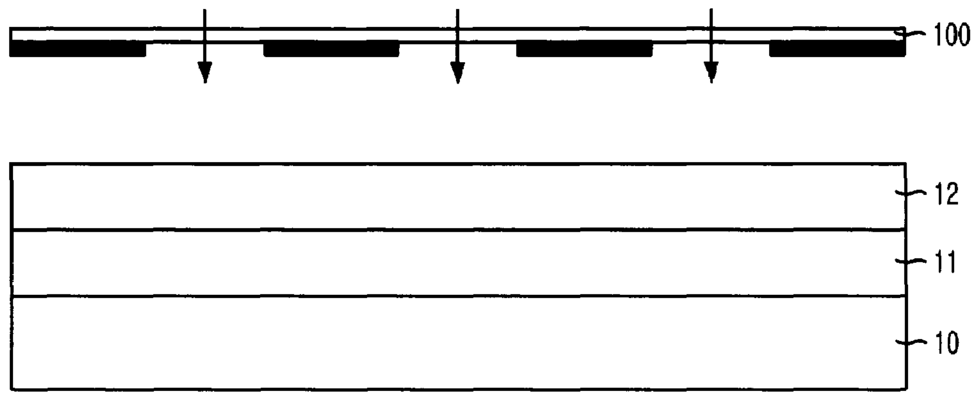
FIGS. 1A to 1E are cross-sectional views illustrating a method for forming an ultra fine contact hole in a semiconductor device in accordance with a preferred embodiment.

Referring to FIG. 1A, an insulation layer 11 is formed on a semiconductor substrate, and a photoresist layer 12 for KrF is coated thereon. Then, a partial portion of the photoresist layer 12 is photo-exposed and developed with use of a photo-exposure process using a reticle 100 and a KrF light source.

Figure 1B:
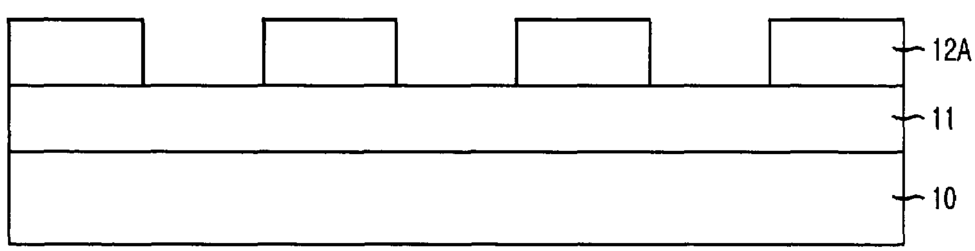

Referring to FIG. 1B, a photoresist pattern 12A exposing a predetermined region for a contact hole on the insulation layer 11 is formed. At this time, a distance between the photoresist patterns 12A, i.e., a critical dimension (CD) of the contact hole, is about 180 nm. Herein, the KrF light source having a wavelength of about 248 nm is used to form such CD.

Figure 1C:
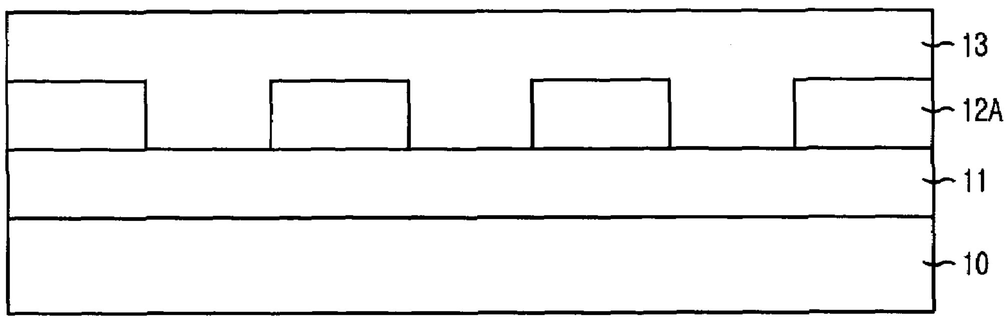

Referring to FIG. 1C, a chemical material-containing layer 13 for a chemically swelling process (CSP) is formed on an entire surface of the semiconductor substrate including the photoresist pattern 12A. Herein, the chemical material-containing layer 13 has reactivity to the photoresist pattern 12A and a resist composition containing de-ionized (DI) water, a cross-linker, a solvent and a photo acid generator (PAG). Particularly, the DI water composes about 90% of the resist composition and the rest compose about 10%. Also, the chemical material-containing layer 13 has a thickness thinner than the photoresist pattern 12A under the consideration of the CD of the contact hole and a subsequent resist flow process (RFP). Preferably, the thickness ranges from about 1000 Å to about 3000 Å. That is, if the thickness of the chemical material-containing layer 13 is below about 1000 Å, it affects a first and a second CD shrinkages due to decreased amounts of the material to be flowed during the RFP.

Figure 1D:
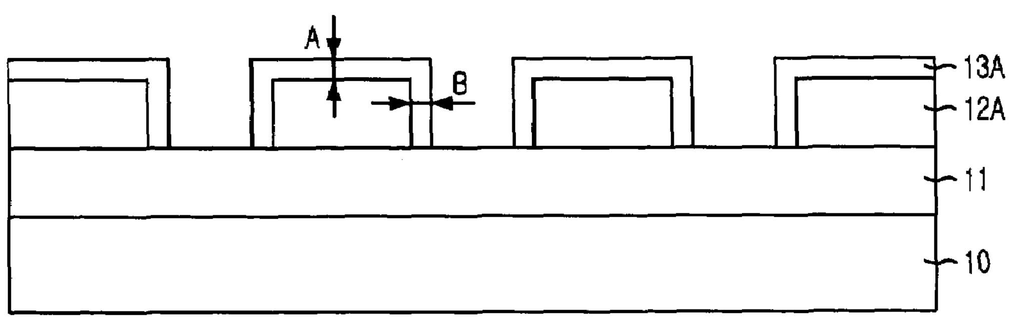

With reference to FIG. 1D, the chemical material-containing layer 13 and the photoresist pattern 12A react with each other by performing the CSP process to form a chemical material-containing pattern 13A, whereby the CD of the contact hole is decreased to about 50 nm in a first set. Then, the substrate is rinsed with DI water. Herein, the CSP can be performed through a heat process, a photo-exposure process or an electron beam exposure process. A temperature during the heat process or photo-exposure energy during the photo-exposure process is maintained in a proper level to obtain a predetermined thickness (refer to A in FIG. 1D) of an upper surface of the chemical material-containing pattern 13A with a consideration of the subsequent RFP as simultaneous as to obtain a predetermined thickness (refer to B in FIG. 1D) of a side wall of the chemical material-containing pattern 13A for decreasing the CD as to a desired one. Preferably, a range of such temperature is between about 90° C. to about 130° C. In case of using a KrF light source, the photo-exposure energy is controlled to be in a range of above about 20 $mJ/cm^2$ to about 30 $mJ/cm^2$ during the photo-exposure process.

Figure 1E:
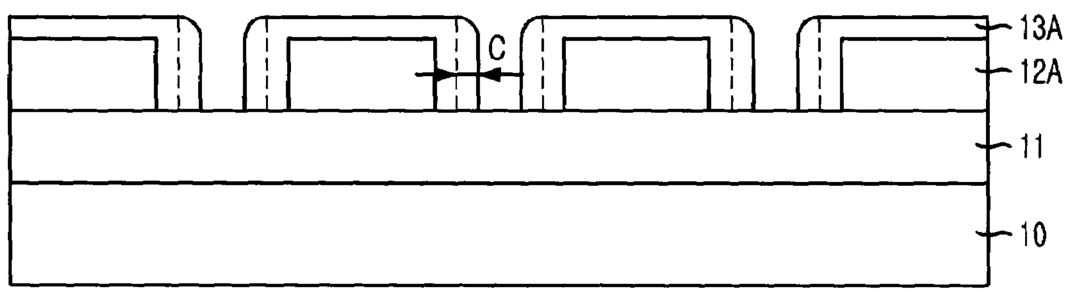

Next, the RFP is performed to make the chemical material-containing pattern 13A flowed so that the thickness of the side wall of the chemical material-containing pattern 13A increases to about a predetermined thickness (refer to C in FIG. 1E). For instance, the CD of the contact hole decreased to about 50 nm in a second set. It is preferable to control a temperature during the RFP to control flow amounts of the resist of the chemical material-containing pattern 13A so that the CD of the contact hole can be decreased to a desired size in the second set. As described above, the CD of the contact hole eventually becomes about 80 nm through the first and the second CD decreases.

Although it is not illustrated in the drawings, the chemical material-containing pattern 13A and the photoresist pattern 12A are used as an etch mask to etch a lower portion of the insulation layer 11 so that the ultra fine contact hole of which CD is about 80 run is formed.

In accordance with the preferred embodiment, the CSP causes the distance between the photoresist patterns formed with use of the KrF light source, i.e., the CD of the contact hole, to be decreased into a predetermined size. The RFP is subsequently proceeded to make the CD of the contact hole further be decreased to a predetermined size. Based on these two processes, it is possible to form the ultra fine contact hole of which CD is below about 80 nm even with the photo-exposure process using the KrF light source. As a result of this ultra fine contact hole formation, it is possible to fabricate a semiconductor device that can be integrated in an extensively high level without pattern deformations and increases of manufacturing costs.

Also, it is still possible to perform the RFP first and then the CSP contrast to the order proceeded in the preferred embodiment.

While the disclosed methods have been described with respect to certain preferred embodiments, it will be apparent to those skilled in the art that various changes and modifications may be made without departing from the scope of this disclosure as defined in the following claims.

What is claimed is:

1. A method for forming an ultra fine contact hole in a semiconductor device with use of a KrF light source, the method comprising:

forming a KrF photoresist pattern on an insulation layer disposed on a semiconductor substrate, the KrF photoresist pattern exposing a predetermined region of the insulation layer for forming a contact hole in the insulation layer;

forming a chemically swelling process (CSP) layer by depositing a chemical material-containing layer that is reactive to the KrF photoresist pattern on an entire surface of the photoresist pattern and insulating layer;

forming a chemical material-containing pattern encompassing the KrF photoresist pattern by reacting the chemical material-containing layer with the KrF photoresist pattern through the chemically swelling process to decrease a critical dimension of the contact hole;

rinsing the semiconductor substrate; and increasing a thickness of a sidewall of the chemical material-containing pattern to a predetermined thickness by performing a resist flow process (RFP) that makes the chemical material-containing pattern flow decrease the critical dimension (CD) of the contact hole.

2. The method as recited in claim 1, wherein the CSP chemical material-containing layer has a resist composition comprising de-ionized (DI) water, a cross-linker, a solvent and a photo acid generator (PAG), wherein the DI water constitues about 90% of the above composition while the remaining components constitute about 10% thereof.

3. The method as recited in claim 1, wherein the CSP chemical material-containing layer has a thickness ranging from about 1000 Å to about 3000 Å.

4. The method as recited in claim 1, wherein the CSP is carried out by employing a series of processes including a heat process, a photo-exposure process and an electron beam exposure process.

5. The method as recited in claim 4, wherein the heat process is carried out at a temperature ranging from about 90° C. to about 130° C.

6. The method as recited in claim 4, wherein the photo-exposure process uses photo-exposure energy ranging from about 20 $mJ/cm^2$ to about 30 $mJ/cm^2$ in the case of using the a light source.

7. The method as recited in claim 1, wherein at the step of rinsing the semiconductor substrate, DI water is used to rinse the semiconductor substrate.

* * * * *